(12) United States Patent
Wang et al.

(10) Patent No.: US 10,126,151 B2
(45) Date of Patent: Nov. 13, 2018

(54) WAFER-LEVEL CHIP PACKAGE STRUCTURE AND PACKAGING METHOD

(71) Applicant: China Wafer Level CSP Co., Ltd., Suzhou, Jiangsu (CN)

(72) Inventors: Zhiqi Wang, Suzhou (CN); Qiong Yu, Suzhou (CN); Wei Wang, Suzhou (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 0 days.

(21) Appl. No.: 15/507,901

(22) PCT Filed: Sep. 10, 2015

(86) PCT No.: PCT/CN2015/089305
§ 371 (c)(1),
(2) Date: Mar. 1, 2017

(87) PCT Pub. No.: WO2016/037575
PCT Pub. Date: Mar. 17, 2016

(65) Prior Publication Data
US 2017/0284837 A1    Oct. 5, 2017

(30) Foreign Application Priority Data

Sep. 12, 2014    (CN) .......................... 2014 1 0465346

(51) Int. Cl.
*H01L 31/0203*    (2014.01)
*G01D 11/24*    (2006.01)
(Continued)

(52) U.S. Cl.
CPC ......... *G01D 11/245* (2013.01); *G06K 9/0002* (2013.01); *H01L 23/48* (2013.01);
(Continued)

(58) Field of Classification Search
CPC .......... H01L 23/3114; H01L 23/49811; H01L 24/19; G01D 11/245; G06K 9/0002
(Continued)

(56) References Cited

U.S. PATENT DOCUMENTS 5,729,038 A * 3/1998 Young ................. H01L 21/2007
257/432
7,276,738 B2 * 10/2007 Wada ................ H01L 21/76898
257/432
(Continued)

FOREIGN PATENT DOCUMENTS

CN    1308751 A    8/2001
CN    1619816 A    5/2005
(Continued)

OTHER PUBLICATIONS

International Search Report for Application No. PCT/CN2015/089305 dated Dec. 2, 2015.
(Continued)

*Primary Examiner* — Nitin Parekh
(74) *Attorney, Agent, or Firm* — Wolf, Greenfield & Sacks, P.C.

(57) ABSTRACT

A chip package structure and packaging method are provided. The chip package structure includes a sensing chip, a covering layer located on the first surface of the sensing chip, and a plug structure located in the sensing chip. The sensing chip includes a first surface, a second surface opposite to the first surface, and a sensing area located on the first surface. The second surface of the sensing chip faces to a base plate. One end of the plug structure is electrically connected to the sensing area, and the other end of the plug structure is exposed by the second surface of the sensing chip.

23 Claims, 7 Drawing Sheets

(51) Int. Cl.

| | | |
|---|---|---|
| *H01L 23/48* | (2006.01) | |
| *G06K 9/00* | (2006.01) | |
| *H01L 23/31* | (2006.01) | |
| *H01L 21/56* | (2006.01) | |

(52) U.S. Cl.
CPC ......... *H01L 21/561* (2013.01); *H01L 23/3114* (2013.01); *H01L 2224/11* (2013.01)

(58) Field of Classification Search
USPC .......................... 257/98, 99, 432; 438/48, 64
See application file for complete search history.

(56) References Cited

U.S. PATENT DOCUMENTS

| | | | | |
|---|---|---|---|---|
| 7,510,902 | B2* | 3/2009 | Kang | ................ H01L 27/14618 438/22 |
| 8,378,462 | B2* | 2/2013 | Matsumoto | ....... H01L 21/76898 257/182 |
| 2001/0019168 | A1 | 9/2001 | Willer et al. | |
| 2005/0105784 | A1 | 5/2005 | Nam | |
| 2006/0091488 | A1* | 5/2006 | Kang | ................ H01L 27/14618 257/433 |
| 2007/0054419 | A1 | 3/2007 | Paik et al. | |
| 2008/0111228 | A1* | 5/2008 | Yu | ....................... H01L 23/3114 257/690 |
| 2008/0164550 | A1* | 7/2008 | Chen | ................. H01L 27/14618 257/432 |
| 2009/0039449 | A1 | 2/2009 | Chou | |
| 2011/0198732 | A1 | 8/2011 | Lin et al. | |
| 2014/0138788 | A1 | 5/2014 | Kim et al. | |
| 2014/0332665 | A1* | 11/2014 | Jiang | ................... H01L 27/1461 250/208.1 |
| 2015/0035103 | A1* | 2/2015 | Inoue | .................. H01L 27/1464 257/432 |
| 2015/0255358 | A1* | 9/2015 | Wen | ...................... H01L 21/268 257/738 |
| 2017/0140195 | A1* | 5/2017 | Wang | ................... G06K 9/0002 |
| 2017/0162620 | A1* | 6/2017 | Wang | ............... H01L 27/14618 |

FOREIGN PATENT DOCUMENTS

| | | |
|---|---|---|
| CN | 101593761 A | 12/2009 |
| CN | 102163582 A | 8/2011 |
| CN | 102255029 A | 11/2011 |
| CN | 104201115 A | 12/2014 |
| JP | 2003083708 A | 3/2003 |
| JP | 2012214753 A | 11/2012 |
| KR | 20050093752 A | 9/2005 |
| TW | 200908287 A | 2/2009 |
| TW | 201128755 A | 8/2011 |

OTHER PUBLICATIONS

Korean Office Communication for Application No. KR 10-2017-7009322 dated May 3, 2018.

Taiwanese 1$^{st}$ Office Action for Application No. TW 104122981 dated Jul. 19, 2016.

* cited by examiner

WAFER-LEVEL CHIP PACKAGE STRUCTURE AND PACKAGING METHOD

CROSS REFERENCE TO RELATED APPLICATION

This application is the national phase of International Patent Application No. PCT/CN2015/089305, filed on Sep. 10, 2015, which claims priority to Chinese Patent Application No. 201410465346.9, filed with the Chinese State Intellectual Property Office on Sep. 12, 2014, both of which are incorporated herein by reference in their entireties to the maximum extent allowable.

FIELD

The disclosure relate to the technical field of semiconductor fabrication, and in particular to a wafer-level chip package structure and a packaging method thereof.

BACKGROUND

With the development of the modern society, there are growing interests in the importance of personal identification and personal information security. The fingerprint recognition technology is characterized by high safety, high reliability and simple operation because of uniqueness and invariability of a human fingerprint. Thus the fingerprint recognition technology is widely used in various fields for protecting personal information security. Meanwhile, with the development of science and technology, the information security issue of various electronic products has long been a concern in technology development. The need for information security is even more acute in mobile terminals, such as a cell phone, a laptop computer, a tablet computer, and a digital camera.

A fingerprint recognition device senses a fingerprint in a capacitive (electric-field) manner or an inductive manner. The fingerprint recognition device extracts a user fingerprint, converts the user fingerprint into an electrical signal and outputs the electrical signal, thereby acquiring fingerprint information of the user. Specifically, as shown in FIG. 1, which is a schematic cross-sectional structural diagram of a fingerprint recognition device, which includes a base plate 100, a fingerprint recognition chip 101 coupled to a surface of the base plate 100, and a glass base plate 102 covering a surface of the fingerprint recognition chip 101.

Taking a capacitive fingerprint recognition chip as an example, the fingerprint recognition chip 101 includes one or more capacitor plates. Since the epidermis or subdermal layer of a user's finger has raised ridges and recessed valleys, a distance between the ridge and the fingerprint recognition chip 101 is different from a distance between the valley and the fingerprint recognition chip 101 when the user's finger 103 touches a surface of the glass base plate 102. Therefore, a capacitance value between the ridge of the user's finger 103 and the capacitor plate is different from a capacitance value between the valley of the user's finger 103 and the capacitor plate. The fingerprint recognition chip 101 is capable of acquiring the different capacitance values, converting them into corresponding electrical signals and outputting the electrical signals. After gathering the received electrical signals, the fingerprint recognition device can acquire the fingerprint information of the user.

However, the conventional fingerprint recognition device has a high requirement on the sensitivity of the fingerprint recognition chip, limiting the fabrication and application of the fingerprint recognition device.

SUMMARY

A wafer-level chip packaging method is provided according to the embodiments of the disclosure, which comprises: providing a substrate which includes several sensing chip areas, where the substrate has a first surface and a second surface which is opposite to the first surface, and each of the sensing chip areas includes a sensing area located on the first surface; forming a cover layer on the first surface of the substrate; and forming a plug structure in each of the sensing chip areas of the substrate, where one end of the plug structure is electrically connected with the sensing area, and the other end of the plug structure is exposed by the second surface of the substrate.

Optionally, the cover layer may have a Mohs hardness greater than or equal to 8 H, and a dielectric constant greater than or equal to 7.

Optionally, a material of the cover layer may include at least one of an inorganic nanomaterial, a polymeric material, a glass material and a ceramic material.

Optionally, the polymeric material may include at least one of epoxy resin, polyimide resin, benzocyclobutene resin, polybenzoxazole resin, polybutylene terephthalate, polycarbonate, polyethylene terephthalate, polyethylene, polypropylene, polyolefin, urethane, polyolefin, polyethersulfone, polyamide, polyurethane, ethylene vinyl acetate copolymer, and polyvinyl alcohol.

Optionally, a formation process of the cover layer may be a screen-printing process, a spin coating process or a spraying process.

Optionally, the inorganic nanomaterial may include at least one of alumina and cobalt oxide.

Optionally, a formation process of the cover layer may be a chemical vapor deposition process, a physical vapor deposition process, an atomic layer deposition process, a screen-printing process, a spin coating process or a spraying process.

Optionally, a formation process of the plug structure may include: forming a mask layer on the second surface of the substrate, where the second surface of the substrate is exposed by the mask layer in a corresponding position and a shape required for forming the plug structure; etching the substrate by using the mask layer as a mask, to form a through hole in the substrate, where a top of the through hole is located on the second surface of the substrate; forming the plug structure in the through hole; and removing the mask layer after the through hole is formed.

Optionally, the plug structure may include: an insulation layer located on a surface of a side wall of the through hole; a conductive layer located on a surface of the insulation layer and a surface of a bottom of the through hole, where a portion of the conductive layer located on the bottom of the through hole is electrically connected with the sensing area; and a solder-mask layer located on a surface of the conductive layer, where the through hole is filled up with the solder-mask layer.

Optionally, the wafer-level chip packaging method may further include forming a wiring layer and a metal bump on the second surface of the substrate, where the wiring layer is connected with the conductive layer and the metal bump, and the wiring layer and the metal bump are located in the sensing chip area.

Optionally, the plug structure may include: an insulation layer located on a surface of a side wall of the through hole;

and a conductive plug located on a surface of the insulation layer and a surface of a bottom of the through hole, where the through hole is filled up with the conductive plug.

Optionally, the wafer-level chip packaging method may further include: forming a metal bump on a top of the conductive plug exposed by the second surface of the substrate.

Optionally, each of the sensing chip areas may further include: a peripheral area located on the first surface and surrounding the sensing area.

Optionally, a chip circuit and a first solder pad may be located in the peripheral area, where the chip circuit is electrically connected with the sensing area and the first solder pad.

Optionally, the one end of the plug structure may be connected with the first solder pad.

Optionally, the wafer-level chip packaging method may further include: cutting the substrate and the cover layer, to separate the several sensing chip areas and form separate sensing chips, where each of the sensing chips has a first surface and a second surface which is opposite to the first surface, the sensing chip includes a sensing area located on the first surface and a cover layer on the first surface of the sensing chip; providing a base plate; and coupling the sensing chip to the base plate, where the second surface of the sensing chip faces to the base plate.

Optionally, the substrate may further include: a sawing lane area located between adjacent sensing chip areas.

Optionally, a process for cutting the substrate and the cover layer may include: cutting the substrate and the cover layer at the sawing lane area, to separate the several sensing chip areas and form several separate sensing chips.

Optionally, the coupling the sensing chip to the base plate may include: welding the end of the plug structure which is exposed by the second surface of the substrate to the base plate, to electrically connect the plug structure with the base plate.

Optionally, each of the sensing chip areas may further include: a peripheral area located on the first surface and surrounding the sensing area.

Optionally, the wafer-level chip packaging method may further include: before forming the cover layer, forming a chip circuit and a first solder pad in the peripheral area, where the chip circuit is electrically connected with the sensing area and the first solder pad.

Optionally, the one end of the plug structure may be electrically connected with the sensing area via the first solder pad.

Optionally, the base plate may have a first side surface, where the first side surface of the base plate is provided with several second solder pads, and the sensing chip is coupled to the first side surface of the base plate.

Optionally, the plug structure exposed by the second surface of the sensing chip may be electrically connected with the second solder pads.

Optionally, an end of the base plate may be provided with a connection portion for electrically connecting the sensing chip with an external circuit.

Optionally, the wafer-level chip packaging method may further include: forming a guard ring on the side surface of the base plate, where the guard ring surrounds the sensing chip and the cover layer.

Optionally, the wafer-level chip packaging method may further include: forming a housing which encloses the sensing chip, the cover layer and the guard ring, and exposes a portion of the cover layer above the sensing area.

Optionally, the wafer-level chip packaging method may further include: forming a housing which encloses the sensing chip and the cover layer, and exposes a portion of the cover layer above the sensing area.

A wafer-level chip package structure formed by using anyone of the above method is further provided according to the embodiments of the disclosure, where the wafer-level chip package structure includes: a substrate including several sensing chip areas, where the substrate has a first surface and a second surface which is opposite to the first surface, and each of the sensing chip areas includes a sensing area located on the first surface; a cover layer located on the first surface of the substrate; and a plug structure located in the sensing chip area of the substrate, where one end of the plug structure is electrically connected with the sensing area, and the other end of the plug structure is exposed by the second surface of the substrate.

Correspondingly, a chip package structure formed by using anyone of the above method is further provided according to the embodiments of the disclosure, where the chip package structure include: a sensing chip including a first surface and a second surface which is opposite to the first surface, where the sensing chip further includes a sensing area located on the first surface, and the second surface of the sensing chip faces to a base plate; a cover layer located on the first surface of the sensing chip; and a plug structure located in the sensing chip, where one end of the plug structure is electrically connected with the sensing area, and the other end of the plug structure is exposed by the second surface of the sensing chip.

DETAILED DESCRIPTION OF THE EMBODIMENTS

As described in the BACKGROUND, the conventional fingerprint recognition device has a high requirement on the sensitivity of the fingerprint recognition chip, thus the fabrication and application of the fingerprint recognition device are limited.

Figure 1:
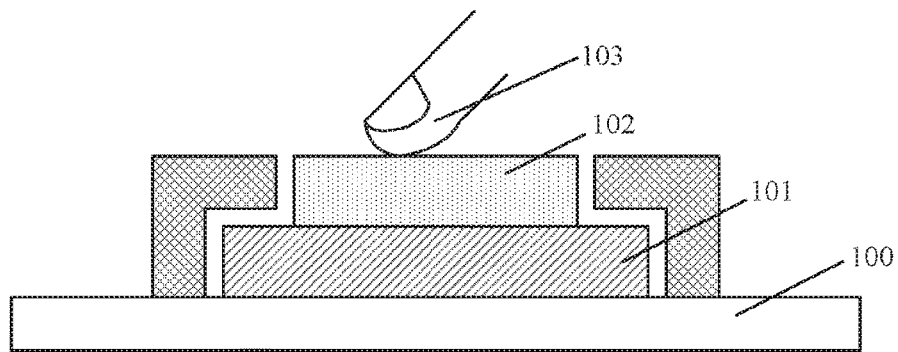
FIG. 1 is a schematic cross-sectional structural diagram of a fingerprint recognition device.

Reference is still made to FIG. 1, it is discovered that, the surface of the fingerprint recognition chip 101 is covered by the glass base plate 102, which is provided for protecting the fingerprint recognition chip 101, and the user's finger 103 directly contacts the glass base plate 102. Therefore, in order to ensure that the glass base plate 102 is capable of providing adequate protection, the glass base plate 102 has a great thickness. However, because of the great thickness of the glass base plate 102, the fingerprint recognition chip 101 is required to have a high sensitivity in order to ensure that the fingerprint of the user can be extracted accurately. However, the fingerprint recognition chips with high sensitivity are difficult to fabricate and expensive to manufacture, which limit the application and promotion of the fingerprint recognition chips.

Specifically, the capacitive fingerprint recognition device is still taken as an example, when the user's finger 103 is placed on the surface of the glass base plate 102, a capacitor is formed between the user's finger 103 and the capacitor plate in the fingerprint recognition chip 101. The user's finger 103 and the capacitor plate constitute two plates of the capacitor, and the glass base plate 102 constitutes a dielectric between the two plates of the capacitor. However, because of the great thickness of the glass base plate 102, a capacitance value between the user's finger 103 and the capacitor plate is great, while a difference of the capacitance value between the ridge and the capacitor plate compared with the capacitance value between the valley and the capacitor plate is small since a height difference between the ridge and the valley of the user's finger 103 is small. Therefore, the fingerprint recognition chip 101 is required to have a high sensitivity in order to accurately detect the difference between the capacitance values.

To solve the above issue, a wafer-level fingerprint recognition chip package structure and a wafer-level fingerprint recognition chip packaging method are provided according to the present disclosure. In the packaging method, instead of the conventional glass base plate, a cover layer is formed on a first surface of a sensing chip (for example, a fingerprint recognition chip), for directly contacting with a user's finger and protecting the sensing chip. Since the cover layer has a smaller thickness than the conventional glass base plate, the distance between the first surface of the sensing chip and a surface of the cover layer can be reduced, such that the sensing chip can easily detect the fingerprint of the user, and accordingly the requirement on the sensitivity of the sensing chip is correspondingly reduced, which enables the widespread use of the fingerprint recognition chip package structure. In addition, before separate sensing chips are formed by cutting, the plug structure is formed in the substrate, and the plug structure is exposed by the second surface of the substrate, such that the plug structure is electrically connected with the substrate. Therefore, after the sensing chip is coupled to the substrate, it is not necessary to form an additional conductive structure on the first surface of the sensing chip. Therefore, the cover layer, which is provided for protecting the sensing area, can be formed on the first surface of the substrate before the substrate is cut. The cover layer is cut when the sensing chips are formed by cutting. Therefore, it is not necessary to form the cover layer after the sensing chip is coupled to the surface of the substrate, thus the fingerprint recognition chip packaging method can be simplified, and damages to the sensing area can be reduced, thereby ensuring the accuracy of the fingerprint information acquired by the sensing area. Further, the formed package structure is simple, which facilitates reducing the size of the formed package structure. To make the above objects, features and advantages of the present disclosure more obvious and easy to be understood, the embodiments of the present disclosure will be described in detail in the following in conjunction with the drawings.

FIGS. 2 to 6 are schematic cross-sectional structural diagrams illustrating a wafer-level fingerprint recognition chip packaging procedure according to an embodiment of the disclosure.

Figure 2:
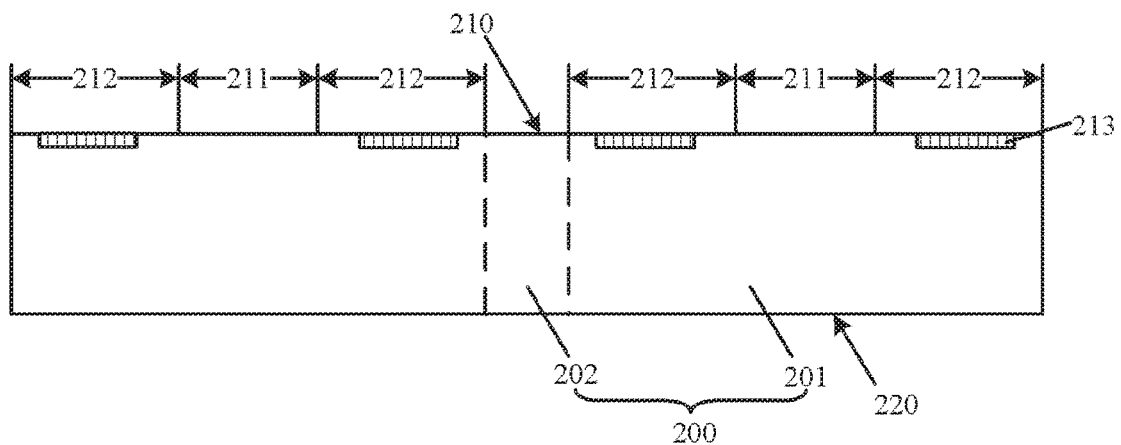
FIGS. 2 to 6 are schematic cross-sectional structural diagrams illustrating a wafer-level fingerprint recognition chip packaging procedure according to an embodiment of the disclosure.

Referring to FIG. 2, a substrate 200 is provided, which includes several sensing chip areas 201. The substrate 200 has a first surface 210 and a second surface 220 which is opposite to the first surface 210, and each of the sensing chip areas 201 includes a sensing area 211 located on the first surface 210.

The substrate 200 is a silicon substrate, a silicon germanium substrate, a silicon carbide substrate, a silicon-on-insulator (SOI) substrate, or a germanium-on-insulator (GOI) substrate. In addition, the substrate 200 is a full wafer.

The sensing chip area 201 is provided for forming a sensing chip. Subsequently, the substrate 200 is cut to separate the several sensing chip areas 201 with each other, to form separate sensing chips. In this embodiment, the sensing chip areas 201 are arranged in an array, and a sawing lane area 202 is further provided between adjacent sensing chip areas 201. The sensing chip areas 201 can be separated with each other by cutting at the sawing lane area 202.

In this embodiment, a sensing area 211 is formed on the first surface 210 of the substrate 200. The sensing area 211 is provided for detecting and receiving fingerprint information of a user. Therefore, a capacitive structure or a conductive structure for acquiring the fingerprint information of the user needs to be formed in the sensing area 211. In addition, a cover layer needs to be formed subsequently on the sensing area 211 for protecting the sensing area 211.

In the following, the description is made by taking a case that the capacitive structure is formed in the sensing area 211 as an example. At least one capacitor plate is formed in the sensing area 211. The cover layer is subsequently formed on the first surface 210 of the substrate 200. When the user's finger is placed on the surface of the cover layer, the capacitor plate, the cover layer and the user's finger form a capacitive structure. The sensing area 211 is capable of acquiring the difference between the capacitance value between the capacitor plate and the ridges on the surface of the user's finger and the capacitance value between the capacitor plate and the valleys on the surface of the user' finger, and the difference between the capacitance values is processed with a chip circuit and outputted, so that the fingerprint information of the user is acquired.

In this embodiment, in the sensing chip area 201, a peripheral area 212 which surrounds the sensing area 211 is further formed on the first surface 210. A chip circuit and a first solder pad 213 are formed in the peripheral area 212. The chip circuit is electrically connected with the sensing area 211 and the first solder pad 213. The first solder pad 213 is provided for electrically connecting with the base plate during the packaging procedure. The chip circuit is electrically connected with the capacitive structure or the conductive structure in the sensing area 211 for processing and outputting the fingerprint information acquired by the sensing area 211.

Figure 3:
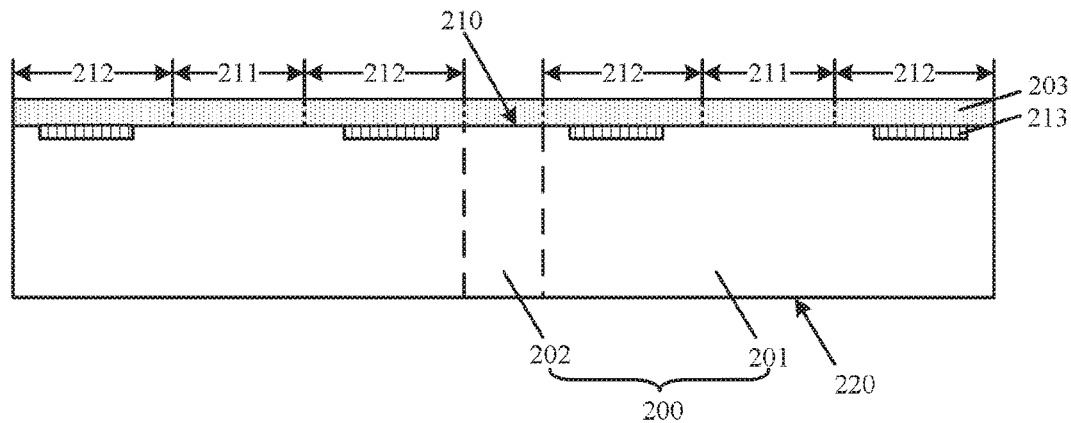

Referring to FIG. 3, a cover layer 203 is formed on the first surface 210 of the substrate 200. The cover layer 203 has a thickness less than 100 microns.

The cover layer 203 is provided for protecting the surface of the sensing area 211. In this embodiment, at least one capacitor plate is formed in the sensing area 211. When the user's finger is placed on the surface of the cover layer 203, the capacitor plate, the cover layer 203 and the user's fingerprint form a capacitive structure.

Since the subsequently formed plug structure is located in the sensing chip area 201 of the substrate 200, extended through the substrate 200, and provided for electrically connecting the sensing area 211 and the chip circuit to an external circuit, it is not necessary to form an additional conductive structure on the first surface 210 of the sensing chip area 201 when packaging the separate sensing chip area 201 in a subsequent process. In addition, before the substrate 200 is cut, the cover layer 203 is formed on the first surface 210 of the substrate 200, such that the cover layer 203 is cut together with the substrate 200. In subsequent processes, a package structure can be formed only by securing the second surface 220 of the cut separate sensing chip area 201 to a surface of a base plate, and electrically connecting the plug structure to the base plate. Therefore, the packaging method of the fingerprint recognition chip can be simplified, and the formed package structure is simple in structure, which facilitates reducing the size of the package structure.

In addition, since during subsequent packaging processes, it is not necessary to form an additional conductive structure on the first surface 210 of the sensing chip area 201, the cover layer 203 may also be formed on the surface of the peripheral area 212 in addition to the surface of the sensing area 211, without influencing subsequent packaging processes. Therefore, after the cover layer 203 is formed on the surface of the substrate 200, it is not necessary to etch and pattern the cover layer 203, which simplifies the fabrication procedure, and reduces damages to the first surface 210 of the substrate 200, thereby ensuring the accuracy of the fingerprint information acquired by the sensing area 211.

A material of the cover layer 203 may be an inorganic nanomaterial, a polymeric material, a glass material and a ceramic material. The cover layer 203 may be formed by a chemical vapor deposition process, a physical vapor deposition process, an atomic layer deposition process, a screen-printing process, a spin coating process or a spraying process.

In an embodiment, the material of the cover layer 203 is a polymeric material, which may be epoxy resin, polyimide resin, benzocyclobutene resin, polybenzoxazole resin, polybutylene terephthalate, polycarbonate, polyethylene terephthalate, polyethylene, polypropylene, polyolefin, urethane, polyolefin, polyethersulfone, polyamide, polyurethane, ethylene vinyl acetate copolymer, or polyvinyl alcohol. The cover layer 203 is formed by a screen-printing process, a spin coating process or a spraying process.

In another embodiment, the material of the cover layer 203 is an inorganic nanomaterial, which is alumina or cobalt oxide. The cover layer 203 is formed by a chemical vapor deposition process, a physical vapor deposition process, an atomic layer deposition process, a screen-printing process, a spin coating process or a spraying process.

In other embodiments, the material of the cover layer 203 is a glass material or a ceramic material, which is a hard material. Therefore, the cover layer 203 needs to be secured to the first surface of the substrate 200 with an adhesive layer. The adhesive layer has adhesiveness and may be made of capacitive screen glue.

The cover layer 203 has a Mohs hardness greater than or equal to 8 H. The cover layer 203 has a relatively great hardness. Therefore, the cover layer 203 is capable of protecting the sensing area 211 in the sensing chip area 201 even in a case of having a relatively small thickness. When the user's finger slides on the surface of the cover layer 203, no damage is caused to the surface of the sensing chip area 201. In addition, because of the relatively great hardness of the cover layer 203, the cover layer is less prone to deformation. Therefore, the thickness of the cover layer 203 hardly changes even when the user's finger presses the surface of the cover layer 203, thus the accuracy of the detection result from the sensing area 211 is ensured.

The cover layer 203 has a dielectric constant greater than or equal to 7. Because of the relatively great dielectric constant, the cover layer 203 has an excellent electrical isolation capability, and thus the cover layer 203 is capable of providing effective protection to the sensing area 211.

The cover layer 203 has a thickness of 20 microns to 200 microns. Because of the relatively small thickness of the cover layer 203, when the user's finger is placed on the surface of the cover layer 203, the distance between the finger and the sensing area 211 is reduced. Therefore, the fingerprint of the user's finger can be better detected by the sensing area 211, reducing the high requirement on the sensitivity of the sensing area 211.

The thickness of the cover layer 203 is relatively small, and the capacitance value between the user's finger and the capacitor plate is inversely proportional to the thickness of the cover layer 203, and directly proportional to the dielectric constant of the cover layer 203. Therefore, in a case that the cover layer 203 has a small thickness and a great dielectric constant, the capacitance value between the user's finger and the capacitor plate is in a detectable range of the sensing area 211, thereby avoiding detection failures of the sensing area 211 due to an excessively great or small capacitance value.

In addition, in a case that the cover layer 203 has a thickness of 20 microns to 200 microns and a dielectric constant greater than or equal to 7, the dielectric constant of the cover layer 203 increases as the thickness of the cover layer 203 increases, which increases the capacitance value between the user's finger and the capacitor plate. As a result, the capacitance value is more detectable by the sensing area 211.

Figure 4:
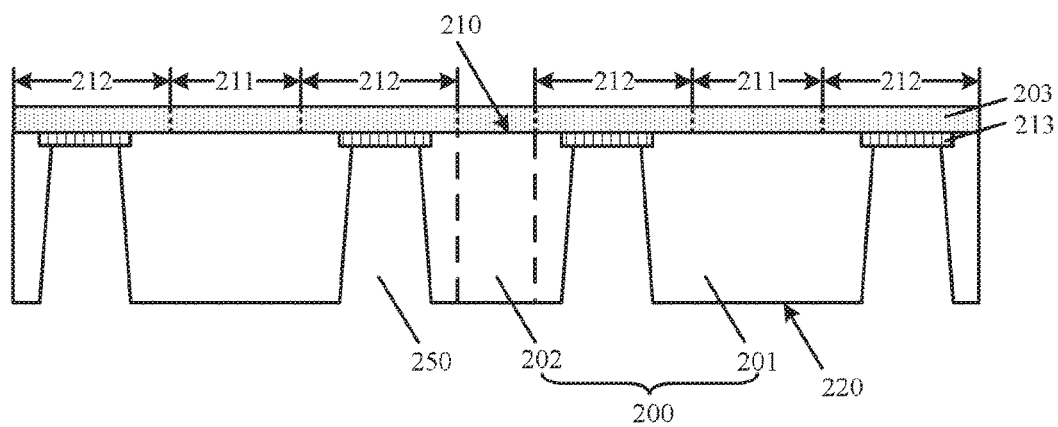

Referring to FIG. 4, a through hole 250 is formed in the sensing chip area 201 of the substrate 200. A top of the through hole 250 is located on the second surface 220 of the substrate 200.

A conductive structure, i.e., a conductive layer or a conductive plug, is formed in the through hole 250. The conductive layer or the conductive plug is used as a trench plug structure, which is provided for electrically connecting the sensing chip and the base plate during the packaging procedure.

The through hole 250 may be formed by: forming a mask layer (not shown in the drawings) on the second surface 220 of the substrate 200, where the second surface 220 of the substrate 200 is exposed by the mask layer in a corresponding position and a shape required for forming the plug structure; etching the substrate 200 by using the mask layer as a mask, to form the through hole 250 in the substrate 200; and removing the mask layer after the through hole 250 is formed.

In this embodiment, since the first solder pad 213 is formed on the surface of the peripheral area 212, and one end of the plug structure which is to be formed subsequently is located on a surface of the first solder pad 213, a portion of the second surface 220 of the substrate 200 corresponding to the position of the first solder pad 213 is exposed by the mask layer, and the process for etching the substrate 200 is performed until the surface of the first solder pad 213 is exposed.

The mask layer may be a patterned photoresist layer, or a patterned hard mask. A material of the hard mask is one or more of silicon oxide, silicon nitride and silicon oxynitride. The process for etching the substrate 200 is an anisotropic dry etch process. An etching gas may include one or more of $SF_6$, $CH_4$, $CHF_3$, $CH_3F$. A side wall of the formed through hole 250 is perpendicular to the surface of the substrate 200. Alternatively, the side wall of the through hole 250 is inclined relative to the surface of the substrate 200. In addition, a size of the top of the through hole 250 is greater than a size of a bottom of the through hole 250.

Figure 5:
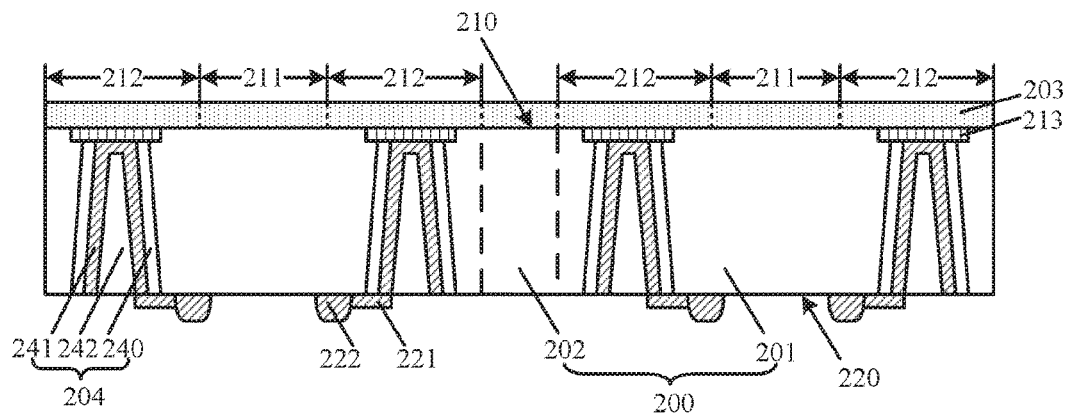

Referring to FIG. 5, a plug structure 204 is formed in the through hole 250 (as shown in FIG. 4), where one end of the plug structure 204 is electrically connected with the sensing area 211, and the other end of the plug structure 204 is exposed by the second surface 220 of the substrate 202.

The plug structure 204 is formed in the through hole 250 and located on the surface of the first solder pad 213. The plug structure 204 is electrically connected with the first solder pad 213, thereby electrically connecting with the sensing area 211. A surface of the other end of the plug structure 204 is flush with the second surface 220 of the substrate, thereby electrically connecting the plug structure 204 with an external circuit outside the substrate 200. Thus the sensing area 211 and the chip circuit can be electrically connected with the external circuit.

In this embodiment, the plug structure 204 includes: the through hole 250 located in the substrate 200, where the top of the through hole 250 is located on the second surface 220 of the substrate 200; an insulation layer 240 located on a surface of the side wall of the through hole 250; a conductive layer 241 located on a surface of the insulation layer 240 and a surface of the bottom of the through hole 250, where a portion of the conductive layer 241 located on the bottom of the through hole 241 is electrically connected with the sensing area 211; and a solder-mask layer 242 located on a surface of the conductive layer 241, where the through hole is filled up with the solder-mask layer 242.

The plug structure 204 may be formed by: forming the insulation layer 240 on the surface of the side wall of the through hole 250; depositing a conductive film one the second surface 220 of the substrate, the surface of the insulation layer 240, and the surface of the bottom of the through hole 250; depositing a solder-mask film on a surface of the conductive film, where the through hole 250 is filled up with the solder-mask film; polishing the solder-mask film and the conductive film, until the second surface 220 of the substrate 200 is exposed, thereby forming the conductive layer 241 and the solder-mask layer 242 in the through hole 250.

A material of the insulation layer 240 is silicon oxide, silicon nitride, silicon oxynitride or a high-k dielectric material. The insulation layer 240 is provided for electrically isolating the conductive layer 241 from the substrate 200. A material of the conductive layer 241 is metal, which is one of copper, tungsten, aluminum, titanium, titanium nitride, tantalum, and tantalum nitride, or a combination thereof. In this embodiment, the through hole is not fully filled up with the conductive layer 241. Therefore, the solder-mask layer 242 needs to be formed on the surface of the conductive layer 241, and the through hole is filled up with the solder-mask layer 242, thereby forming a stable plug structure 204. A material of the solder-mask layer is a polymeric material, such as insulating resin, or is an inorganic insulating material, such as silicon oxide, silicon nitride or silicon oxynitride.

After the plug structure 204 is formed, the packaging method further includes: forming a wiring layer 221 and a metal bump 222 on the second surface 220 of the substrate 200, where the wiring layer 221 is connected with the conductive layer 241 and the metal bump 222, and the wiring layer 221 and the metal bump 222 are located on the surface of the sensing chip area 201. Materials of the wiring layer 221 and the metal bump 222 are metal such as copper, tungsten, or aluminum. The wiring layer 221 and the metal bump 222 are provided for electrically connecting the plug structure 204 with an external circuit outside the substrate 200.

Figure 6:
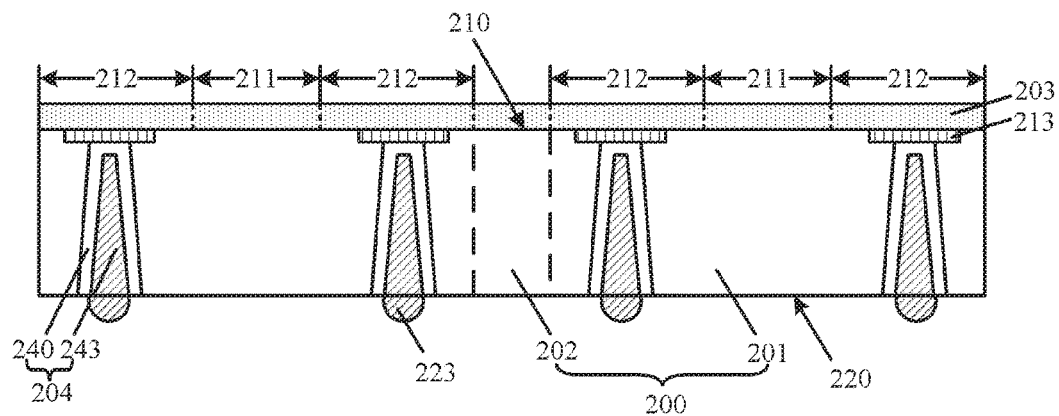

In another embodiment, referring to FIG. 6, the plug structure 204 includes: a through hole located in the substrate 200, where a top of the through hole is located on the second surface 220 of the substrate 200; an insulation layer 240 located on a surface of a side wall of the through hole; and a conductive plug 243 located on a surface of the insulation layer 240 and a surface of a bottom of the through hole, where the through hole is filled up with the conductive plug 243.

A material of the insulation layer 240 is silicon oxide, silicon nitride, silicon oxynitride or a high-k dielectric material. The insulation layer 240 is provided for electrically isolating the conductive plug 243 from the substrate 200. A material of the conductive plug 243 is metal, which is one of copper, tungsten, aluminum, titanium, titanium nitride, tantalum, and tantalum nitride, or a combination thereof.

After the plug structure 204 is formed, the method further includes: forming a metal bump 223 on a top of the conductive plug 243 exposed by the second surface 220 of the substrate 200. The metal bump 223 is provided for electrically connecting the plug structure 204 with an external circuit outside the substrate 200.

In another embodiment, after the plug structure is formed in the substrate, a cover layer may also be formed on the first surface of the substrate.

Reference is still made to FIG. 5, correspondingly, a wafer-level fingerprint recognition chip package structure formed by using the above method is further provided according to the embodiments of the disclosure. The wafer-level fingerprint recognition chip package structure includes a substrate 200 including several sensing chip areas 201, where the substrate 200 has a first surface 210 and a second surface 220 which is opposite to the first surface 210, and the sensing chip area 201 includes a sensing area 211 located on the first surface 210. The wafer-level fingerprint recognition chip package structure further includes a cover layer 203 located on the first surface 210 of the substrate 200, where the cover layer 203 has a thickness smaller than 100 microns; and a plug structure 204 located in the sensing chip area 201 of the substrate 200, where one end of the plug structure 204 is electrically connected with the sensing area 211, and the other end of the plug structure 204 is exposed by the second surface 220 of the substrate 200.

In the following, the wafer-level fingerprint recognition chip structure is described in detail in conjunction with drawings.

The substrate 200 is a silicon substrate, a silicon germanium substrate, a silicon carbide substrate, a silicon-on-insulator (SOI) substrate, or a germanium-on-insulator (GOI) substrate. In addition, the substrate 200 is a full wafer.

The sensing chip area 201 is provided for forming a sensing chip to be packaged. The several sensing chip areas 201 of the substrate 200 are arranged in an array. In this embodiment, the substrate 200 further includes a sawing lane area 202 located between adjacent sensing chip areas 201. The sensing chip areas 201 can be separated with each other by cutting at the sawing lane area 202, thereby forming sensing chips.

The sensing area 211 located on the first surface 210 of the sensing chip area 201 is provided for detecting and receiving fingerprint information of a user. A capacitive structure or a conductive structure for acquiring the fingerprint information of the user is provided in the sensing area 211, and a cover layer 203 located on the first surface 210 of the substrate 200 is provided for protecting the sensing area 211.

In this embodiment, at least one capacitor plate is provided in the sensing area 211. When the user's finger is placed on the surface of the cover layer 203, the capacitor plate, the cover layer 203 and the user's finger form a capacitive structure. The sensing area 211 is capable of acquiring the difference between the capacitance value between the ridges on the surface of the user's finger and the capacitor plate and the capacitance value between the valleys on the surface of the user' finger and the capacitor plate, and the difference between the capacitance values is processed with a chip circuit and outputted, so that the fingerprint information of the user is acquired.

In this embodiment, the sensing chip area 201 further includes a peripheral area 212 which is located on the first surface 210 and surrounds the sensing area 211. A chip circuit and a first solder pad 213 are provided in the peripheral area 212. The chip circuit is electrically connected with the capacitive structure or the conductive structure in the sensing area 211 for processing electrical signals outputted by the capacitive structure or the conductive structure.

The chip circuit is electrically connected with the sensing area 211 and the first solder pad 213, and the one end of the plug structure 204 is connected with the first solder pad 213, thereby electrically connecting the plug structure 204 with the sensing area 211. In addition, since the plug structure 204 is exposed by the second surface 220 of the substrate 200, the sensing area 211 located on the first surface 210 of the substrate 200 can be electrically connected with an external circuit outside the substrate 200 by means of the plug structure 204.

The plug structure 204 is located in the substrate 200. Further, in this embodiment, the plug structure 204 is located in an area corresponding to the peripheral area 212, and the sensing area 211 can be electrically connected with an external circuit outside the substrate 200 by means of the plug structure 204. Therefore, when packaging the separate sensing chip area 201, it is not necessary to form an additional conductive structure on the first surface 210 of the sensing chip area 201. Therefore, before the substrate 200 is cut, the cover layer 203 is formed on the first surface 210 of the substrate 200, such that the cover layer 203 is cut together with the substrate 200.

Since the first surface 210 of the substrate 200 is completely covered by the cover layer 203, which means, the cover layer 203 is also located on the surfaces of the peripheral area 212 and the sawing lane area 202 in addition to the surface of the sensing area 211. Since the cover layer 203 covers a large area, the cover layer 203 can be formed in a simple manner, and the process for forming the cover layer 203 does not cause damage to the first surface 210 of the sensing chip area 201. In addition, the separate sensing chip area 201 can be packaged subsequently in a simple manner.

Further, since it is not necessary to form an additional conductive structure on the first surface 210 of the sensing chip area 201 when packaging the separate sensing chip area 201 in a subsequent process, the first surface 210 of the sensing chip area 201 is flat, that is, the surface of the sensing area 211 is flush with the surface of the peripheral area 212, and it is not necessary to form an additional peripheral recess in the peripheral area 212 in order to form a conductive structure connected with the sensing area 211. Therefore, the formed wafer-level fingerprint recognition chip package structure is simple in structure, and the formation process is simplified.

A material of the cover layer 203 is a polymeric material, an inorganic nanomaterial, or a ceramic material. In this embodiment, the material of the cover layer 203 is an inorganic nanomaterial which includes aluminum oxide and cobalt oxide. The cover layer 203 may be formed by a chemical vapor deposition process, a physical vapor deposition process, an atomic layer deposition process, a screen-printing process, a spraying process or a spin coating process.

In another embodiment, the material of the cover layer 203 is a polymeric material, which may be epoxy resin, polyimide resin, benzocyclobutene resin, polybenzoxazole resin, polybutylene terephthalate, polycarbonate, polyethylene terephthalate, polyethylene, polypropylene, polyolefin, urethane, polyolefin, polyethersulfone, polyamide, polyurethane, ethylene vinyl acetate copolymer, polyvinyl alcohol or other suitable polymeric materials. The cover layer 203 may be formed by a screen-printing process, a spraying process or a spin coating process.

The cover layer 203 has a Mohs hardness greater than or equal to 8 H. The cover layer 203 has a relatively great hardness. Therefore, the cover layer 203 is capable of protecting the sensing area 211 of the sensing chip 201 even in a case of having a relatively small thickness. When the user's finger slides on the surface of the cover layer 203, no damage is caused to the surface of the sensing chip 201. In addition, because of the relatively great hardness of the cover layer 203, the cover layer 203 is less prone to deformation. Therefore, the thickness of the cover layer 203 hardly changes even when the user's finger presses the surface of the cover layer 203, thus the accuracy of the detection result from the sensing area 211 is ensured.

The cover layer 203 has a dielectric constant greater than or equal to 7. Because of the relatively great dielectric constant, the cover layer 203 has an excellent electrical isolation capability, and thus the cover layer 203 is capable of providing effective protection to the sensing area 211.

The cover layer 203 has a thickness of 20 microns to 200 microns. Because of the relatively small thickness of the cover layer 203, when the user's finger is placed on the surface of the cover layer 203, the distance between the finger and the sensing area 211 is reduced. Therefore, the fingerprint of the user's finger can be better detected by the sensing area 211, thus the high requirement on the sensitivity of the sensing chip 201 is reduced.

The thickness of the cover layer 203 is relatively small, and the capacitance value between the user's finger and the capacitor plate is inversely proportional to the thickness of the cover layer 203, and directly proportional to the dielectric constant of the cover layer 203. Therefore, in a case that the cover layer 203 has a small thickness and a great dielectric constant, the capacitance value between the user's finger and the capacitor plate is in a detectable range of the sensing area 211, thereby avoiding detection failures of the sensing area 211 due to an excessively great or small capacitance value.

In addition, in a case that the cover layer 203 has a thickness of 20 microns to 200 microns and a dielectric constant greater than or equal to 7, the dielectric constant of the cover layer 203 increases as the thickness of the cover layer 203 increases, which increases the capacitance value between the user's finger and the capacitor plate. As a result, the capacitance value is more detectable by the sensing area 211.

In this embodiment, the plug structure 204 includes: a through hole located in the substrate 200, where a top of the through hole is located on the second surface 220 of the substrate 200; an insulation layer 240 located on a surface of a side wall of the through hole; a conductive layer 241 located on a surface of the insulation layer 240 and a surface of a bottom of the through hole, where a portion of the conductive layer 241 located on the bottom of the through hole 241 is electrically connected with the sensing area 211;

and a solder-mask layer 242 located on a surface of the conductive layer 241, where the through hole is filled up with the solder-mask layer 242.

A material of the insulation layer 240 is silicon oxide, silicon nitride, silicon oxynitride or a high-k dielectric material. The insulation layer 240 is provided for electrically isolating the conductive layer 241 from the substrate 200. A material of the conductive layer 241 is metal, which is one of copper, tungsten, aluminum, titanium, titanium nitride, tantalum, and tantalum nitride, or a combination thereof. In this embodiment, the through hole is not filled up with the conductive layer 241. Therefore, the solder-mask layer 242 needs to be formed on the surface of the conductive layer 241, and the through hole is filled up with the solder-mask layer 242, thereby forming a stable plug structure 204. A material of the solder-mask layer is a polymeric material, such as insulating resin, or is an inorganic insulating material, such as silicon oxide, silicon nitride or silicon oxynitride.

The wafer-level fingerprint recognition chip package structure further includes: a wiring layer 221 and a metal bump 222 located on the second surface 220 of the substrate 200. The wiring layer 221 is connected with the conductive layer 241 and the metal bump 222, and the wiring layer 221 and the metal bump 222 are located on the surface of the sensing chip area 201. The wiring layer 221 and the metal bump 222 are provided for electrically connecting the plug structure 204 with an external circuit outside the substrate 200.

Referring to FIG. 6, in another embodiment, the plug structure 204 includes: a through hole located in the substrate 200, where a top of the through hole is located on the second surface 220 of the substrate 200; an insulation layer 240 located on a surface of a side wall of the through hole; and a conductive plug 243 located on a surface of the insulation layer 240 and a surface of a bottom of the through hole, where the through hole is filled up with the conductive plug 243.

A material of the insulation layer 240 is silicon oxide, silicon nitride, silicon oxynitride or a high-k dielectric material. The insulation layer 240 is provided for electrically isolating the conductive layer 241 from the substrate 200. A material of the conductive plug 243 is metal, which is one of copper, tungsten, aluminum, titanium, titanium nitride, tantalum, and tantalum nitride, or a combination thereof.

The wafer-level fingerprint recognition chip package structure further includes: a metal bump 223 located on a top of the conductive plug 243 exposed by the second surface 220 of the substrate 200. The metal bump 223 is provided for electrically connecting the plug structure 204 with an external circuit outside the substrate 200.

FIGS. 7 to 14 are schematic cross-sectional structural diagrams illustrating a wafer-level fingerprint recognition chip packaging procedure according to another embodiment of the disclosure.

Figure 7:
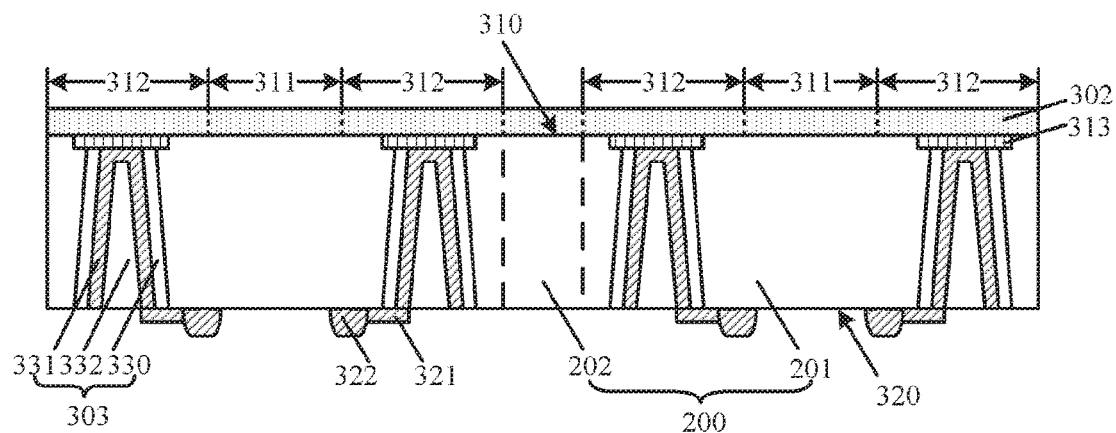
FIGS. 7 to 14 are schematic cross-sectional structural diagrams illustrating a wafer-level fingerprint recognition chip packaging procedure according to another embodiment of the disclosure.

Referring to FIG. 7, a substrate 200 is provided, which includes several sensing chip areas 201. The substrate 200 has a first surface 310 and a second surface 320 which is opposite to the first surface 310. The sensing chip area 201 includes a sensing area 311 located on the first surface 310. A plug structure 303 is formed in the sensing chip area 201 of the substrate 200. One end of the plug structure 303 is electrically connected with the sensing area 311, and the other end of the plug structure 303 is exposed by the second surface 320 of the substrate 200. A cover layer 302 is formed on the first surface 310 of the substrate 200, where the cover layer 302 has a thickness smaller than 100 microns.

In this embodiment, the sensing chip areas 201 are arranged in an array, and a sawing lane area 202 is further provided between adjacent sensing chip areas 201.

In this embodiment, in the sensing chip area 201, a peripheral area 312 which surrounds the sensing area 311 is further formed on the first surface 311. A chip circuit and a first solder pad 313 are formed in the peripheral area 312, and the chip circuit is electrically connected with the sensing area 311 and the first solder pad 313.

In this embodiment, the plug structure 303 includes: a through hole located in the sensing chip 301, where a top of the through hole is located on the second surface 320 of the substrate 200; an insulation layer 330 located on a surface of a side wall of the through hole; a conductive layer 331 located on a surface of the insulation layer 330 and a surface of a bottom of the through hole, where a portion of the conductive layer 331 located on the bottom of the through hole is electrically connected with the sensing area 311; and a solder-mask layer 332 located on a surface of the conductive layer 331, where the through hole is filled up with the solder-mask layer 332.

In this embodiment, after the plug structure 303 is formed, the packaging method further includes: forming a wiring layer 321 and a metal bump 322 on the second surface of the substrate, where the wiring layer 321 is connected with the conductive layer 331 and the metal bump 322, and the wiring layer 321 and the metal bump 322 are located on the surface of the sensing chip area 201.

Figure 11:
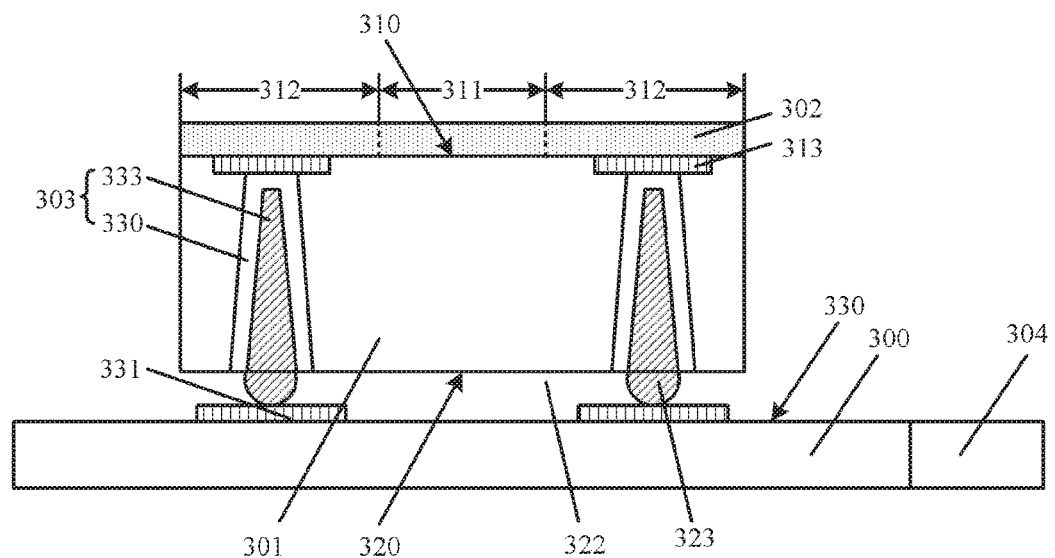

Referring to FIG. 11, in another embodiment, the plug structure 303 includes: a through hole located in the sensing chip 301, where a top of the through hole is located on the second surface 320 of the sensing chip 301; an insulation layer 330 located on a surface of a side wall of the through hole; and a conductive plug 333 located on a surface of the insulation layer 330 and a surface of a bottom of the through hole, where the through hole is filled up with the conductive plug 333.

For details of materials, structures and formation processes of the substrate 200, the plug structure 303 and the cover layer 302, reference may be made to the description in the embodiments corresponding to FIGS. 2 to 6, which is not repeatedly described herein.

Figure 8:
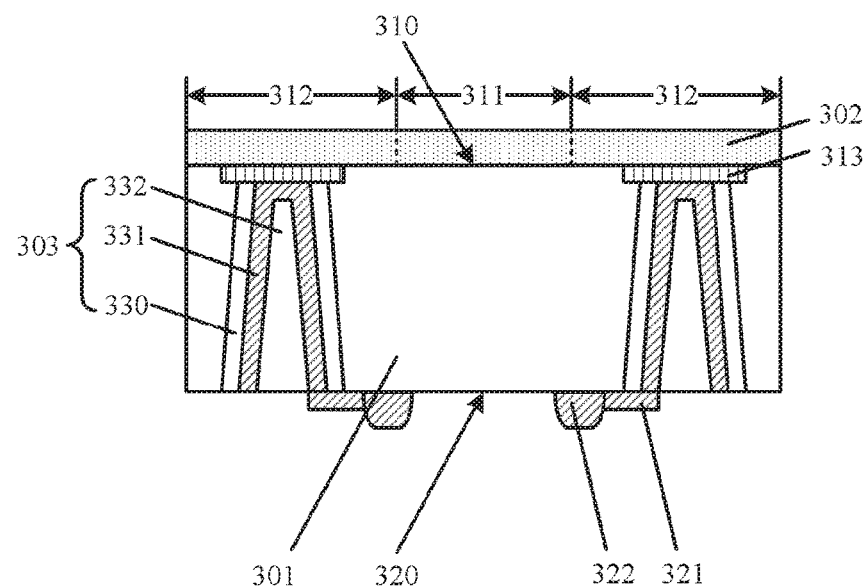

Referring to FIG. 8, the substrate 200 (as shown in FIG. 7) and the cover layer 302 are cut, to separate the several sensing chip areas 201 (as shown in FIG. 7) and form several separate sensing chips 301. The sensing chip 301 has a first surface and a second surface 320 which is opposite to the first surface 310. The sensing chip 301 includes a sensing area 311 located on the first surface 310, and a cover layer 302 is provided on the first surface 310 of the sensing chip 301.

The process for cutting the substrate 200 and the cover layer 302 includes: cutting the substrate 200 and the cover layer 302 at the sawing lane area 202 (as shown in FIG. 7), to separate the several sensing chip areas 201 and form several separate sensing chips 301.

Since the cover layer 302 is formed on the first surface 310 of the substrate 200, when the substrate 200 is cut, the cover layer 302 is cut together, such that the first surface 310 of each formed separate sensing chip 301 is covered by the cover layer 302. Therefore, in subsequent processes, a package structure can be formed only by electrically connecting the sensing chip 301 with the base plate. Therefore, the formation process of the fingerprint recognition chip package structure can be simplified, and the formed package structure is simple in structure, which facilitates reducing the size of the package structure.

Figure 9:
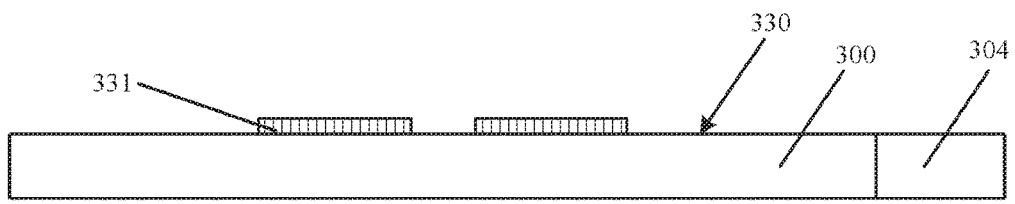

Referring to FIG. 9, a base plate 300 is provided.

The base plate 300 may be a rigid base plate or a flexible base plate, depending on requirements to a device or a terminal to which the sensing chip 301 is applied. In this embodiment, the base plate 300 is a rigid base plate, which may be a PCB base plate, a glass base plate, a metal base plate, a semiconductor base plate or a polymer base plate.

The base plate 300 has a first side surface 330 which is provided with several second solder pads 331 and a wiring layer (not shown). The wiring layer is connected with the second solder pads 331, The second solder pads 331 are provided for connecting with the chip circuit on the first surface 310 of the sensing chip 301, such that the sensing chip 301 is coupled to the first side surface 330 of the base plate 300.

In this embodiment, an end of the base plate 300 is provided with a connection portion 304. A material of the connection portion 304 includes a conductive material. The connection portion 304 is connected with the wiring layer, such that the sensing area 311 on the surface of the sensing chip 301 is electrically connected with an external circuit or device, thereby transmitting electrical signals.

Figure 10:
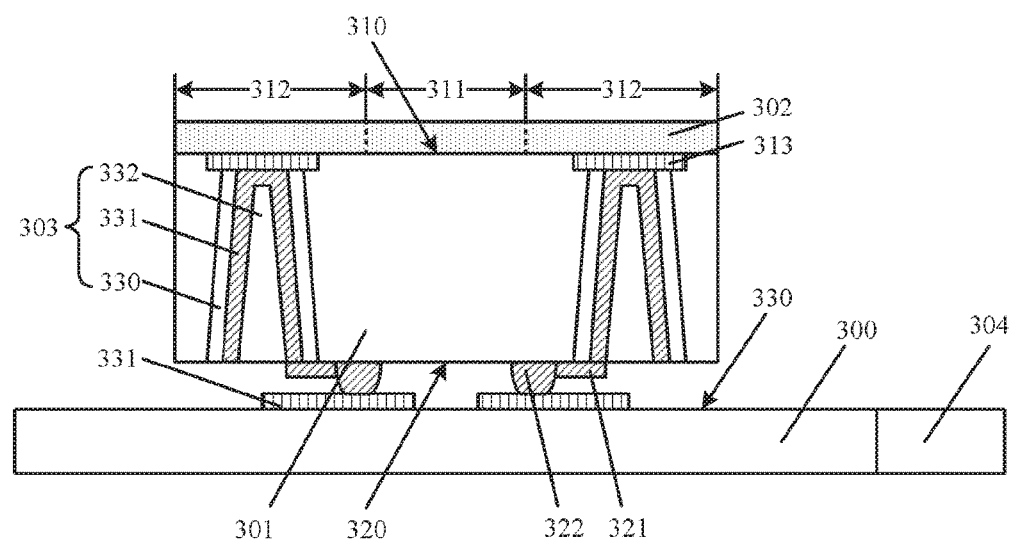

Referring to FIG. 10, the sensing chip 301 is coupled to the base plate 300, where the second surface 320 of the sensing chip 301 faces to the base plate 300.

Since an end of the plug structure 303 is exposed by the second surface 320 of the sensing chip 301, the method of coupling the sensing chip 301 to the base plate 300 includes: welding the end of the plug structure 303 which is exposed by the second surface 320 of the sensing chip 301 to the base plate 300, such that the plug structure 303 is electrically connected with the base plate 300.

In this embodiment, the first side surface 330 of the base plate 300 is provided with second solder pads 331, and the sensing chip 301 is secured to the first side surface 330 of the base plate 300. In addition, the plug structure 303 which is exposed by the second surface 320 of the sensing chip 301 is welded to a surface of the second solder pads 331, thereby electrically connecting the sensing chip 301 with the base plate 300.

Figure 12:
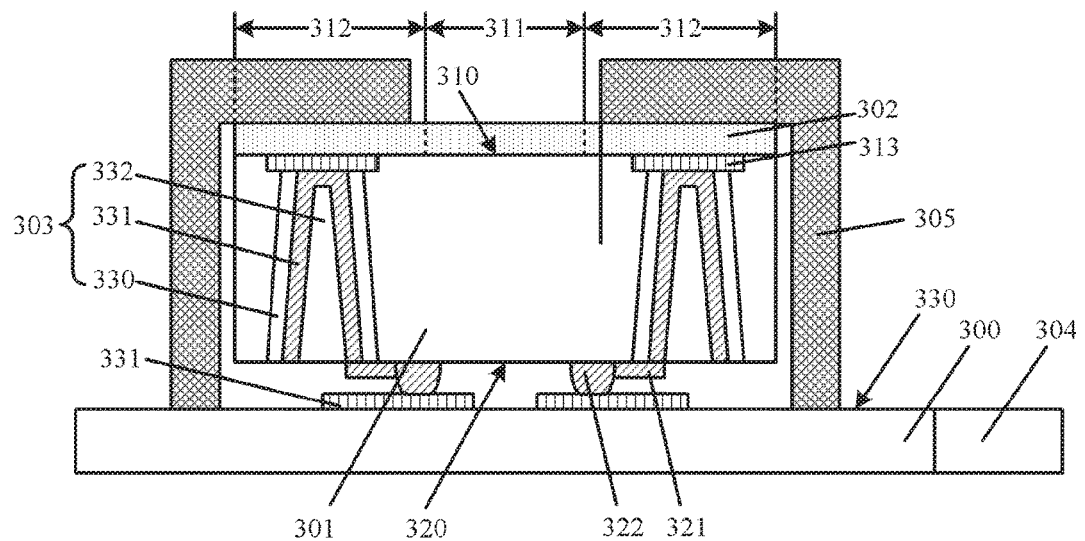

Referring to FIG. 12, in an embodiment, after the sensing chip 301 is coupled to the base plate 300, a guard ring 305 is formed on the base plate 300, where the guard ring 305 surrounds the sensing chip 301 and the cover layer 302. A material of the guard ring 305 is metal. In addition, the guard ring 305 is secured to the first side surface 330 of the base plate 300 and is grounded via the base plate 300.

In this embodiment, the guard ring 305 is located around the sensing chip 301 and the cover layer 302, and a portion of the guard ring 305 is extended above the cover layer 302, and exposes a surface of a portion of the cover layer 305 above the sensing area 311. In another embodiment, the guard ring is located merely around the sensing chip 301 and the cover layer 302, and exposes the entire surface of the cover layer 302.

A material of the guard ring 305 is metal, which may be copper, tungsten, aluminum, silver, or gold. The guard ring 305 is used as an electrostatic shield for the sensing chip 301. Since the guard ring 305 is metallic, it is capable of conducting electricity. When the user's finger touches the cover layer 302, the generated electrostatic charges are first transmitted to the base plate 300 via the guard ring 305, thereby avoiding breakdown of the cover layer 302 due to an excessively high electrostatic voltage. Thus the sensing chip 301 is protected, the accuracy of fingerprint detection can be enhanced, noises in signals outputted by the sensing chip can be eliminated, and the accuracy of signals outputted by the sensing chip can be improved.

Figure 13:
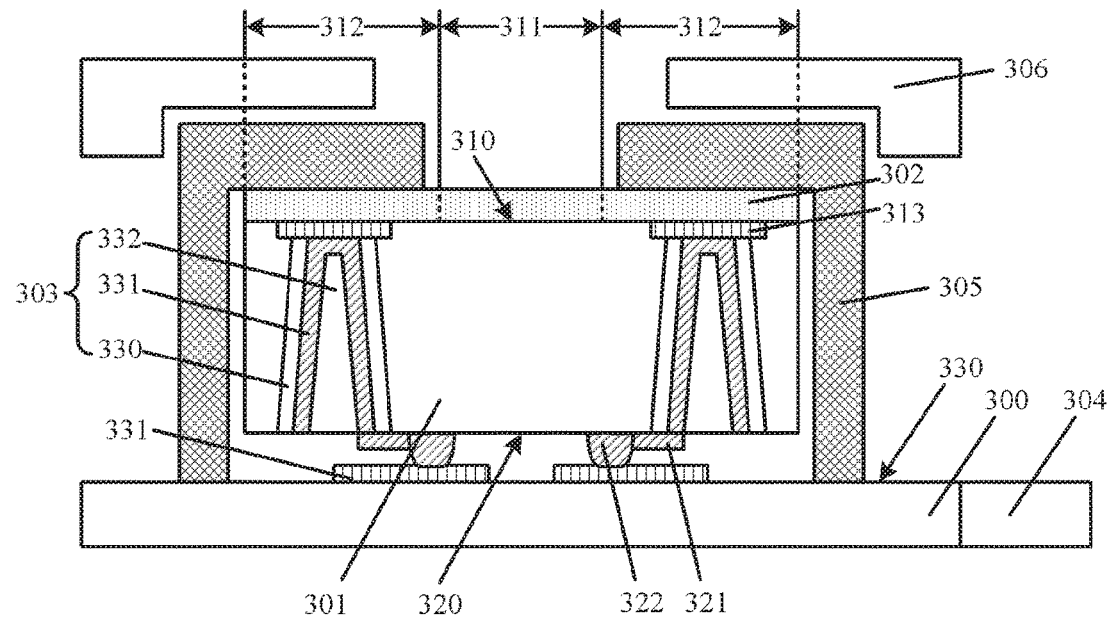

Referring to FIG. 13, in another embodiment, after the guard ring 305 is formed, a housing 306 which encloses the sensing chip 301, the cover layer 302 and the guard ring 305 is formed. A portion of the cover layer on the surface of the sensing area 311 is exposed by the housing 306. The housing 306 may be a housing of a device or terminal provided with the fingerprint recognition chip, or may be a housing of the fingerprint recognition chip package structure.

Figure 14:
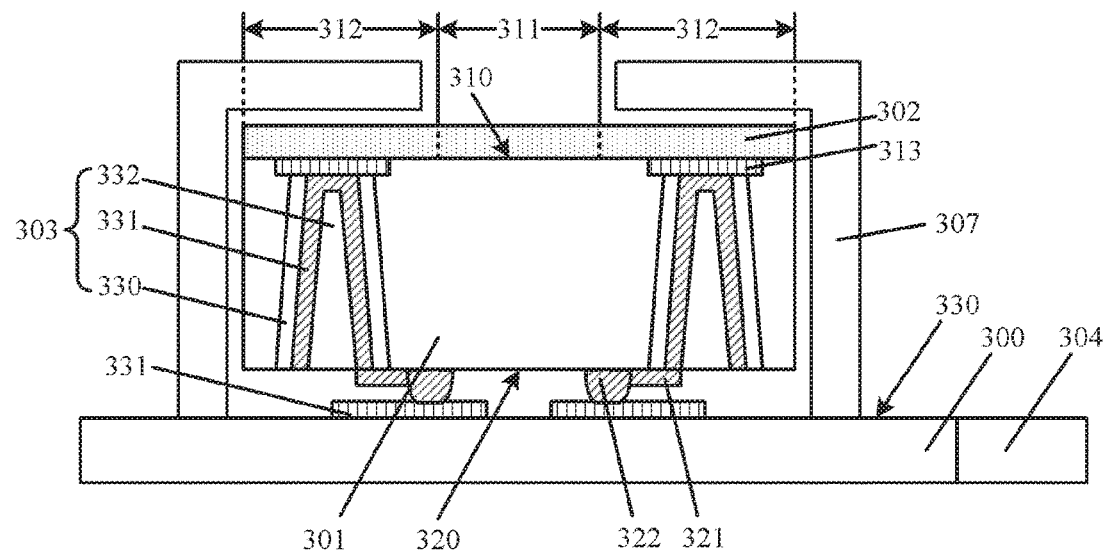

Referring to FIG. 14, in another embodiment, after the sensing chip 301 is coupled to the base plate 300, a housing 307 which encloses the sensing chip 301 and the cover layer 302 is formed. A portion of the cover layer 302 on the surface of the sensing area 311 is exposed by the housing 307. The housing 307 is provided for protecting the sensing chip 301 and the cover layer 302. In addition, since in this embodiment, the sensing chip 301 is secured to the base plate 300 with the plug structure 303, it is not necessary to secure the sensing chip 301 using a plastic encapsulant material. The housing 307 is provided for electrical isolation the sensing chip 301 from the external environment.

In other embodiment, after the sensing chip 301 is coupled to the base plate 300, an insulating material such as a plastic encapsulant material is filled between the sensing chip 301 and the base plate 300 for protecting the wiring layer 321, the metal bump 322 and the second solder pads 331, as well as enhancing the bonding strength between the sensing chip 301 and the base plate 300.

Correspondingly, a fingerprint recognition chip package structure is further provided according to the embodiments of the present disclosure. Reference is still made to FIG. 10, the fingerprint recognition chip package structure includes: a base plate 300 and a sensing chip 301 coupled to the base plate 300. The sensing chip 301 includes a first surface 310 and a second surface 320 which is opposite to the first surface 310. The sensing chip 301 includes a sensing area 311 located on the first surface 310, and the second surface 320 of the sensing chip 301 faces to the base plate 300. The fingerprint recognition chip package structure includes a cover layer 302 located on the first surface 310 of the sensing chip 301, where the cover layer 302 has a thickness less than 100 microns; and a plug structure 303 located in the sensing chip 301, where one end of the plug structure 303 is electrically connected with the sensing area 311, and the other end of the plug structure 303 is exposed by the second surface 320 of the sensing chip 301. The plug structure 303 exposed by the second surface 320 of the sensing chip 301 is connected with the base plate 300.

In the following, the fingerprint recognition chip package structure is described in detail in conjunction with the drawings.

The sensing area 311 located on the first surface 310 of the sensing chip 301 is provided for detecting and receiving fingerprint information of a user. A capacitive structure or a conductive structure for acquiring the fingerprint information of the user is provided in the sensing area 311, and the cover layer 302 located on the first surface 310 of the sensing chip 301 is provided for protecting the sensing area 311.

In this embodiment, at least one capacitor plate is provided in the sensing area 311. When the user's finger is placed on the surface of the cover layer 302, the capacitor plate, the cover layer 302 and the user's finger form a capacitive structure. The sensing area 311 is capable of acquiring the difference between the capacitance value between the ridges on the surface of the user's finger and the capacitor plate and the capacitance value between the valleys on the surface of the user' finger and the capacitor plate, and the difference between the capacitance values is processed with a chip circuit and outputted, so that the fingerprint information of the user is acquired.

In this embodiment, the sensing chip area 301 further includes a peripheral area 312 which is located on the first surface 310 and surrounds the sensing area 311. A chip circuit and a first solder pad 313 are provided in the peripheral area 312. The chip circuit is electrically connected with the capacitive structure or the conductive structure in the sensing area 311 for processing electrical signals outputted by the capacitive structure or the conductive structure.

The chip circuit is electrically connected with the sensing area 311 and the first solder pad 313, and the one end of the plug structure 303 is connected with the first solder pad 313, thereby electrically connecting the plug structure 303 with the sensing area 311. In addition, since the plug structure 303 is exposed by the second surface 320 of the substrate 200, the sensing area 311 located on the first surface 310 of the substrate 200 can be electrically connected with an external circuit outside the substrate 200 by means of the plug structure 303.

The sensing chip 301 is secured to the base plate 300, thereby electrically connecting the sensing chip 301 with other devices or circuits through the base plate 300. In this embodiment, an end of the plug structure 303 is exposed by the second surface 320 of the sensing chip 301, and the sensing chip 301 is secured to the base plate 300 with the plug structure 303.

The base plate 300 may be a rigid base plate or a flexible base plate, depending on requirements to a device or a terminal provided with the sensing chip 301. In this embodiment, the base plate 300 is a rigid base plate, which may be a PCB base plate, a glass base plate, a metal base plate, a semiconductor base plate or a polymer base plate.

The base plate 300 has a first side surface 330 which is provided with several second solder pads 331 and a wiring layer (not shown), where the wiring layer is connected with the second solder pads 331, and the second solder pads 331 are provided for connecting with the chip circuit on the first surface 310 of the sensing chip 301, such that the sensing chip 301 is coupled to the first side surface 330 of the base plate 300.

In this embodiment, the plug structure 303 which is exposed by the second surface 320 of the sensing chip 301 is welded to a surface of the second solder pads 331, such that the sensing chip 301 is secured to the first side surface 330 of the base plate 300, and the sensing area 311 located on the first surface 301 of the sensing chip 301 is electrically connected with the wiring layer on the base plate 300 through the plug structure 303.

In this embodiment, an end of the base plate 300 is provided with a connection portion 304. A material of the connection portion 304 includes a conductive material. The connection portion 304 is connected with the wiring layer, such that the sensing area 311 on the surface of the sensing chip 301 is electrically connected with an external circuit or device, thereby transmitting electrical signals.

A material of the cover layer 302 is a polymeric material, an inorganic nanomaterial, or a ceramic material. In this embodiment, the material of the cover layer 302 is an inorganic nanomaterial which includes aluminum oxide and cobalt oxide. The cover layer 302 may be formed by a screen-printing process, a spraying process or a spin coating process.

In another embodiment, the material of the cover layer 302 is a polymeric material, which may be epoxy resin, polyimide resin, benzocyclobutene resin, polybenzoxazole resin, polybutylene terephthalate, polycarbonate, polyethylene terephthalate, polyethylene, polypropylene, polyolefin, urethane, polyolefin, polyethersulfone, polyamide, polyurethane, ethylene vinyl acetate copolymer, polyvinyl alcohol or other suitable polymeric materials. The cover layer 302 may be formed by a screen-printing process, a spraying process or a spin coating process.

The cover layer 302 has a Mohs hardness greater than or equal to 8 H. The cover layer 302 has a relatively great hardness. Therefore, the cover layer 302 is capable of protecting the sensing area 311 of the sensing chip 301 even in a case of having a relatively small thickness. When the user's finger slides on the surface of the cover layer 302, no damage is caused to the surface of the sensing chip 301. In addition, because of the relatively great hardness of the cover layer 302, the cover layer 302 is less prone to deformation. Therefore, the thickness of the cover layer 302 hardly changes even when the user's finger presses the surface of the cover layer 302, thus the accuracy of the detection result from the sensing area 311 is ensured.

The cover layer 302 has a dielectric constant greater than or equal to 7. Because of the relatively great dielectric constant, the cover layer 302 has an excellent electrical isolation capability, and thus the cover layer 302 is capable of providing effective protection to the sensing area 311.

The cover layer 302 has a thickness of 20 microns to 200 microns. Because of the relatively small thickness of the cover layer 302, when the user's finger is placed on the surface of the cover layer 302, the distance between the finger and the sensing area 311 is reduced. Therefore, the fingerprint of the user's finger can be better detected by the sensing area 311, thus the high requirement on the sensitivity of the sensing chip 301 is reduced.

The thickness of the cover layer 302 is relatively small, and the capacitance value between the user's finger and the capacitor plate is inversely proportional to the thickness of the cover layer 302, and directly proportional to the dielectric constant of the cover layer 302. Therefore, in a case that the cover layer 302 has a small thickness and a great dielectric constant, the capacitance value between the user's finger and the capacitor plate is in a detectable range of the sensing area 311, thereby avoiding detection failures of the sensing area 311 due to an excessively great or small capacitance value.

In addition, in a case that the cover layer 302 has a thickness of 20 microns to 200 microns and a dielectric constant greater than or equal to 7, the dielectric constant of the cover layer 302 increases as the thickness of the cover layer 302 increases, which increases the capacitance value between the user's finger and the capacitor plate. As a result, the capacitance value is more detectable by the sensing area 311.

Since the plug structure 303 is located in the sensing chip 301 and in this embodiment the plug structure 303 is located in an area corresponding to the peripheral area 312, the sensing area 311 can be electrically connected with the wiring layer on the base plate 300 by means of the plug structure 303. Therefore, when the sensing chip 301 is packaged, it is not necessary to provide an additional conductive structure on the first surface 310 of the sensing chip 301. Thus the fingerprint recognition chip package structure is simple in structure, which facilitates reducing the size of the package structure.

The first surface 310 of the sensing chip 301 is completely covered by the cover layer 302, thus it is not necessary to provide the cover layer 302 on the first surface 310 of the sensing chip 301 after the sensing chip 301 is secured to the base plate 300. Therefore, the damage caused by the process for forming the cover layer 302 to the first surface 310 of the sensing chip 301 can be avoided.

In this embodiment, the plug structure 303 includes: a through hole located in the sensing chip 301, where a top of the through hole is located on the second surface 320 of the substrate 200; an insulation layer 330 located on a surface of a side wall of the through hole; a conductive layer 331 located on a surface of the insulation layer 330 and a surface of a bottom of the through hole, where a portion of the conductive layer 331 located on the bottom of the through hole is electrically connected with the sensing area 311; and a solder-mask layer 332 located on a surface of the conductive layer 331, where the through hole is filled up with the solder-mask layer 332.

A material of the insulation layer 330 is silicon oxide, silicon nitride, silicon oxynitride or a high-k dielectric material. The insulation layer 330 is provided for electrically isolating the conductive layer 331 and the substrate 200. A material of the conductive layer 331 is metal, which is one of copper, tungsten, aluminum, titanium, titanium nitride, tantalum, and tantalum nitride, or a combination thereof. In this embodiment, the through hole is not fully filled up with the conductive layer 331. Therefore, the solder-mask layer 332 needs to be formed on the surface of the conductive layer 331, and the through hole is filled up with the solder-mask layer 332, thereby forming a stable plug structure 303. A material of the solder-mask layer is a polymeric material, such as insulating resin, or is an inorganic insulating material, such as silicon oxide, silicon nitride or silicon oxynitride.

The fingerprint recognition chip package structure further includes: a wiring layer 321 and a metal bump 322 located on the second surface 320 of the sensing chip 301, where the wiring layer 321 is connected with the conductive layer 331 and the metal bump 322. The wiring layer 321 and the metal bump 322 are provided for electrically connecting the plug structure 303 with an external circuit outside the substrate 200.

Referring to FIG. 11, in another embodiment, the plug structure 303 includes: a through hole located in the sensing chip 301, where a top of the through hole is located on the second surface 320 of the sensing chip 301; an insulation layer 330 located on a surface of a side wall of the through hole; and a conductive plug 333 located on a surface of the insulation layer 330 and a surface of a bottom of the through hole, where the through hole is filled up with the conductive plug 333.

A material of the insulation layer 330 is silicon oxide, silicon nitride, silicon oxynitride or a high-k dielectric material. The insulation layer 330 is provided for electrically isolating the conductive plug 333 and the sensing chip 301. A material of the conductive plug 333 is metal, which is one of copper, tungsten, aluminum, titanium, titanium nitride, tantalum, and tantalum nitride, or a combination thereof.

The fingerprint recognition chip package structure further includes: a metal bump 323 located on a top of the conductive plug 333 exposed by the second surface 320 of the sensing chip 301. The metal bump 323 is provided for electrically connecting the plug structure 303 with an external circuit outside the substrate 200.

Referring to FIG. 12, in another embodiment, the fingerprint recognition chip package structure further includes: a guard ring 305 located on the base plate 300, where the guard ring 305 surrounds the sensing chip 301 and the cover layer 302.

A material of the guard ring 305 is metal. In addition, the guard ring 305 is secured to the first side surface 330 of the base plate 300 and is grounded via the base plate 300.

In this embodiment, the guard ring 305 is located around the sensing chip 301 and the cover layer 302, and a portion of the guard ring 305 is extended above the cover layer 302, and exposes a surface of a portion of the cover layer 305 above the sensing area 311. In another embodiment, the guard ring is located merely around the sensing chip 301 and the cover layer 302, and exposes an entire surface of the cover layer 302.

A material of the guard ring 305 is metal, which may be copper, tungsten, aluminum, silver, or gold. The guard ring 305 is used as an electrostatic shield for the sensing chip 301.

Since the guard ring 305 is metallic, it is capable of conducting electricity. When the user's finger touches the cover layer 302, the generated electrostatic charges are first transmitted to the base plate 300 via the guard ring 305, thereby avoiding breakdown of the cover layer 302 due to an excessively high electrostatic voltage. Thus the sensing chip 301 is protected, the accuracy of fingerprint detection can be enhanced, noises in signals outputted by the sensing chip can be eliminated, and the accuracy of signals outputted by the sensing chip can be improved.

Referring to FIG. 13, in another embodiment, the fingerprint recognition chip package structure further includes: a housing 306 which encloses the sensing chip 301, the cover layer 302 and the guard ring 305, and exposes a portion of the cover layer 302 on the surface of the sensing area 311. The housing 306 may be a housing of a device or terminal provided with the fingerprint recognition chip, or may be a housing of the fingerprint recognition chip package structure.

Referring to FIG. 14, in another embodiment, the fingerprint recognition chip package structure further includes: a housing 307 which encloses the sensing chip 301 and the cover layer 302, and exposes a portion of the cover layer 302 on the surface of the sensing area 311. The housing 307 is provided for protecting the sensing chip 301 and the cover layer 302. In addition, since in this embodiment, the sensing chip 301 is secured to the base plate 300 with the plug structure 303, it is not necessary to secure the sensing chip 301 using a plastic encapsulant material. The housing 307 is provided for electrical isolation between the sensing chip 301 and the external environment.

In other embodiments, a plastic encapsulant layer which surrounds the sensing chip 301 may be further provided on the base plate 300. The sensing area 311 of the sensing chip 301 is exposed by the plastic encapsulant layer. The plastic encapsulant layer is provided for protecting the sensing chip 301 and electrically isolating the sensing chip 301 from the external environment.

According to the embodiments of the present disclosure, the fingerprint recognition chip packaging method can be simplified, the requirements on the sensitivity of the sensing chip is reduced, thereby achieving wide-spread use of the packaging method.

In the wafer-level fingerprint recognition chip packaging method according to the embodiments of the present disclosure, several sensing chip areas are provided in the substrate, and the several sensing chip areas may be separated with each other by cutting the substrate, thereby forming separate sensing chips. The sensing area on the first surface of the sensing chip area is provided for acquiring finger print information. In addition, instead of the conventional glass base plate, the cover layer is formed on the first surface of the substrate for directly contacting with a user's finger and protecting the sensing chip. Since the cover layer has a smaller thickness as compared with the conventional glass base plate, the distance between the first surface of the sensing chip and the surface of the cover layer can be reduced, such that the sensing chip can better detect the fingerprint of the user, and the requirement on the sensitivity of the sensing chip is reduced accordingly, which enables the wide-spread use of the fingerprint recognition chip package structure.

In addition, since the plug structure is formed in the substrate, and the plug structure is exposed by the second surface of the substrate, such that the plug structure is electrically connected with an external circuit. The sensing chip can be coupled to the external circuit with the plug structure. Therefore, during subsequent packaging processes, it is not necessary to form an additional conductive structure on the first surface of the sensing chip, thus the cover layer which is provided for protecting the sensing area can be formed on the first surface of the substrate, without influencing subsequent packaging processes. The packaging procedure for forming the wafer-level fingerprint recognition chip package structure is simplified, and damages to the sensing area can be reduced, thereby ensuring the accuracy of the fingerprint information acquired by the sensing area.

Further, instead of the conventional glass base plate, the cover layer is formed on the first surface of the sensing chip for directly contacting with a user's finger and protecting the sensing chip. Since the cover layer has a smaller thickness as compared with the conventional glass base plate, the distance between the first surface of the sensing chip and the surface of the cover layer can be reduced, such that the sensing chip can better detect the fingerprint of the user, and the requirement on the sensitivity of the sensing chip is reduced accordingly, which enables the wide-spread use of the fingerprint recognition chip package structure.

In addition, before separate sensing chips are formed by cutting, the plug structure is formed in the substrate, and the plug structure is exposed by the second surface of the substrate, such that the plug structure is electrically connected with the base plate. Therefore, it is not necessary to form an additional conductive structure on the first surface of the sensing chip after the sensing chip is coupled to the base plate, and the cover layer which is provided for protecting the sensing area can be formed on the first surface of the substrate before cutting the substrate. The cover layer is cut when the sensing chips are formed by cutting. Therefore, it is not necessary to form the cover layer after the sensing chip is coupled to the surface of the substrate, thus the fingerprint recognition chip packaging method can be simplified, and damages to the sensing area can be reduced, thereby ensuring the accuracy of the fingerprint information acquired by the sensing area. Further, the formed package structure is simply, which facilitates reducing the size of the formed package structure.

Further, the cover layer has a Mohs hardness greater than or equal to 8 H. The cover layer has a relatively great hardness. Therefore, the cover layer located on the surface of the sensing area has sufficient strength to protect the sensing area even in a case of having a relatively small thickness. When the user's finger is placed on the surface of the cover layer above the sensing area, the cover is less prone to deformation and wear, thus the fingerprint of the user can be extracted more accurately.

Further, the cover layer has a dielectric constant between 7 to 9, which is significantly great, thus the cover layer has an excellent electrical isolation performance, and is capable of providing better protection to the sensing area. The cover layer on the surface of the sensing area can provide effective electrical isolation between the user's finger and the sensing area even in a case of having a relatively small thickness, which allows a relatively great capacitance value between the user's finger and the sensing area in a detectable range.

Further, the guard ring which surrounds the sensing chip and the cover layer is provided on the base plate. The guard ring is used as an electrostatic shield for the sensing chip, thereby avoiding reduction in the accuracy of the fingerprint information of the user detected by the sensing area, or eliminating noises in signals outputted by the sensing chip. Thus the information detected by the sensing chip and the signals outputted by the sensing chip can be more accurate.

In the wafer-level fingerprint recognition chip package structure according to the embodiments of the present disclosure, the plug structure is provided in the sensing chip area of the substrate. One end of the plug structure is electrically connected with the sensing area, and the other end of the plug structure is exposed by the second surface of the substrate. Therefore, the sensing area can be electrically connected with an external circuit outside the sensing chip area by means of the plug structure. Further, since the plug structure is located in the substrate, it is not necessary to provide an additional conductive wire for electrical connection between the sensing chip area and the external circuit, which facilitates reducing the size of the formed package structure when packaging the separate sensing chip area in subsequent processes. In addition, since it is not necessary to form a connection conductive wire on the first surface of the substrate when forming the package structure in subsequent processes, the cover layer can be provided on the first surface of the substrate. The cover layer can directly contact with the user's finger and is provided for protecting the sensing area. The wafer-level fingerprint recognition chip is simple in structure, and it is easy to form the package structure with the separate sensing chip area in subsequent processes.

Further, the cover layer is located on the first surface of the sensing chip, for replacing the conventional glass base plate. The cover can directly contact with the user's finger for protecting the sensing chip. Moreover, as compared with the conventional glass base plate, the cover layer has a smaller thickness, and thus the distance between the first surface of the sensing chip and the surface of the cover layer can be reduced with the cover layer, such that the sensing chip can better detect the fingerprint of the user. The requirement on the sensitivity of the sensing chip is correspondingly reduced with the package structure, which enables the wide-spread use of the fingerprint recognition chip package structure. In addition, the plug structure is further provided in the sensing chip. One end of the plug structure is electrically connected with the sensing area, and the other end of the plug structure is exposed by the second surface of the sensing chip. Therefore, the sensing chip can be secured to the base plate, and the sensing area can be electrically connected with the base plate by means of the plug structure exposed by the second surface of the sensing chip. The package structure is simple in structure and can be easily assembled, therefore the manufacturing costs of the package structure is lowered, while its production yield is improved.

The technical solutions are disclosed as above, but not limited thereto. Various alternations and modifications can be made to the technical solutions of the present disclosure by those skilled in the art without deviation from the spirit and scope of the present disclosure. Therefore, the scope of protection of the present disclosure is defined by the appended claims.

The invention claimed is:

1. A chip package structure, comprising:
    a substrate comprising a sensing chip area, wherein the substrate has a first surface and a second surface which is opposite to the first surface, and the sensing chip area comprises a sensing area located on the first surface;
    a cover layer on the first surface of the substrate;
    a plug structure adjacent to the sensing chip area of the substrate, wherein one end of the plug structure is electrically connected with the sensing area, and the other end of the plug structure is exposed by the second surface of the substrate;
    and wherein the cover layer has a Mohs hardness greater than or equal to 8 H, and a dielectric constant greater than or equal to 7.

2. The chip package structure according to claim 1, further comprising a base plate, wherein the other end of the plug structure is electrically connected with the base plate.

3. The chip package structure according to claim 2, wherein an end of the base plate is provided with a connection portion for electrically connecting the sensing chip area with an external circuit.

4. The chip package structure according to claim 2, wherein
    the base plate has a first side surface which is provided with a plurality of second solder pads; and
    the other end of the plug structure is electrically connected with the respective second solder pad.

5. The chip package structure according to claim 2, further comprising a guard ring located on the base plate, wherein the guard ring surrounds the substrate and the cover layer.

6. The chip package structure according to claim 5, further comprising a housing which encloses the substrate, the cover layer and the guard ring and exposes a portion of the cover layer above the sensing area.

7. The chip package structure according to claim 1, wherein a material of the cover layer comprises at least one of an inorganic nanomaterial, a polymeric material, a glass material and a ceramic material.

8. The chip package structure according to claim 7, wherein the polymeric material comprises at least one of epoxy resin, polyimide resin, benzocyclobutene resin, polybenzoxazole resin, polybutylene terephthalate, polycarbonate, polyethylene terephthalate, polyethylene, polypropylene, polyolefin, urethane, polyolefin, polyethersulfone, polyamide, polyurethane, ethylene vinyl acetate copolymer, and polyvinyl alcohol.

9. The chip package structure according to claim 7, wherein the inorganic nanomaterial comprises at least one of alumina and cobalt oxide.

10. The chip package structure according to claim 1, wherein
    the substrate further comprises a peripheral area located on the first surface and surrounding the sensing area;
    the peripheral area is provided with a chip circuit and a first solder pad;
    the chip circuit is electrically connected with the sensing area and the first solder pad; and
    the one end of the plug structure is electrically connected with the first solder pad.

11. A wafer-level chip package structure, comprising:
    a substrate comprising a plurality of sensing chip areas, wherein the substrate has a first surface and a second surface which is opposite to the first surface, and each of the sensing chip areas comprises a sensing area located on the first surface;
    a cover layer on the first surface of the substrate;
    a plug structure adjacent to each of the sensing chip areas of the substrate, wherein one end of the plug structure is electrically connected with the sensing area, and the other end of the plug structure is exposed by the second surface of the substrate;
    and wherein the cover layer has a Mohs hardness greater than or equal to 8 H, and a dielectric constant greater than or equal to 7.

12. A wafer-level chip packaging method, comprising:
    providing a substrate which comprises a plurality of sensing chip areas, wherein the substrate has a first surface and a second surface which is opposite to the first surface, and each of the sensing chip areas comprises a sensing area located on the first surface;
    forming a cover layer on the first surface of the substrate;
    forming a plug structure adjacent to each of the sensing chip areas of the substrate, wherein one end of the plug structure is electrically connected with the respective sensing area, and the other end of the plug structure is exposed by the second surface of the substrate;
    and wherein the cover layer has a Mohs hardness greater than or equal to 8 H, and a dielectric constant greater than or equal to 7.

13. The wafer-level chip packaging method according to claim 12, wherein a material of the cover layer comprises at least one of an inorganic nanomaterial, a polymeric material, a glass material and a ceramic material.

14. The wafer-level chip packaging method according to claim 13, wherein the polymeric material comprises at least one of epoxy resin, polyimide resin, benzocyclobutene resin, polybenzoxazole resin, polybutylene terephthalate, polycarbonate, polyethylene terephthalate, polyethylene, polypropylene, polyolefin, urethane, polyolefin, polyethersulfone, polyamide, polyurethane, ethylene vinyl acetate copolymer, and polyvinyl alcohol.

15. The wafer-level chip packaging method according to claim 14, wherein the cover layer is formed by a screen-printing process, a spin coating process or a spraying process.

16. The wafer-level chip packaging method according to claim 13, wherein the inorganic nanomaterial comprises at least one of alumina and cobalt oxide.

17. The wafer-level chip packaging method according to claim 16, wherein the cover layer is formed by a chemical vapor deposition process, a physical vapor deposition process, an atomic layer deposition process, a screen-printing process, a spin coating process or a spraying process.

18. The wafer-level chip packaging method according to claim 12, wherein the forming the plug structure comprises:
    forming a mask layer on the second surface of the substrate;
    etching the substrate by using the mask layer as a mask, to form a through hole; and
    forming the plug structure in the through hole.

19. The wafer-level chip packaging method according to claim 12, wherein
    each of the sensing chip areas further comprises a peripheral area located on the first surface and surrounding the sensing area;
    the peripheral area is provided with a chip circuit and a first solder pad;

the chip circuit is electrically connected with the sensing area and the first solder pad; and the one end of the plug structure is electrically connected with the first solder pad.

20. The wafer-level chip packaging method according to claim 12, further comprising:

cutting the substrate and the cover layer, to separate the plurality of sensing chip areas and form separate sensing chips, wherein each of the sensing chips has a first surface and a second surface which is opposite to the first surface, the sensing chip comprises a sensing area located on the first surface and a cover layer on the first surface of the sensing chip;

providing a base plate; and coupling the sensing chip to the base plate, wherein the second surface of the sensing chip faces to the base plate.

21. The wafer-level chip packaging method according to claim 20, wherein the base plate has a first side surface which is provided with a plurality of second solder pads; and the other end of the plug structure is electrically connected with the respective second solder pad.

22. The wafer-level chip packaging method according to claim 20, further comprising:

forming a guard ring on the base plate, wherein the guard ring surrounds the sensing chip and the cover layer.

23. The wafer-level chip packaging method according to claim 22, further comprising:

forming a housing which encloses the sensing chip, the cover layer and the guard ring and exposes a portion of the cover layer.

* * * * *